(12) United States Patent
Ullmann et al.

(10) Patent No.: US 6,175,452 B1
(45) Date of Patent: Jan. 16, 2001

(54) OPTICAL ARRANGEMENT FOR USE IN A LASER DIODE ARRANGEMENT

(75) Inventors: Christoph Ullmann, Bad Honnef; Volker Krause, Hohr-Grenzhausen, both of (DE)

(73) Assignee: Laserline Gesellschaft fur Entwicklung und Vertrieb von Diodenlasem mbH (DE)

( * ) Notice: Under 35 U.S.C. 154(b), the term of this patent shall be extended for 0 days.

(21) Appl. No.: 09/389,020

(22) Filed: Sep. 2, 1999

(30) Foreign Application Priority Data

Sep. 2, 1998 (DE) .............................. 198 39 902

(51) Int. Cl.⁷ .......................... G02B 27/10; G02B 27/30
(52) U.S. Cl. ............................. 359/641; 359/618
(58) Field of Search .................... 359/618, 619, 359/641, 204

(56) References Cited

U.S. PATENT DOCUMENTS

| | | | |
|---|---|---|---|
| 5,128,919 | * | 7/1992 | Narahara et al. ............... 369/97 |
| 5,541,951 | * | 7/1996 | Juhasz et al. ............... 372/101 |
| 5,808,803 | * | 9/1998 | Ullmann et al. ............... 359/641 |
| 5,986,794 | * | 11/1999 | Krause et al. ............... 359/222 |

FOREIGN PATENT DOCUMENTS 197 05 574
    A1    2/1997  (DE) .

* cited by examiner

*Primary Examiner*—Ricky Mack
(74) *Attorney, Agent, or Firm*—Hoffman, Wasson & Gitler

(57) ABSTRACT

The invention relates to a novel optical arrangement for use in a laser diode arrangement and a laser diode arrangement with one such optical arrangement. The arrangement uses a fast axis collimator that is segmented to maintain parallel beams and limit distortion.

11 Claims, 5 Drawing Sheets

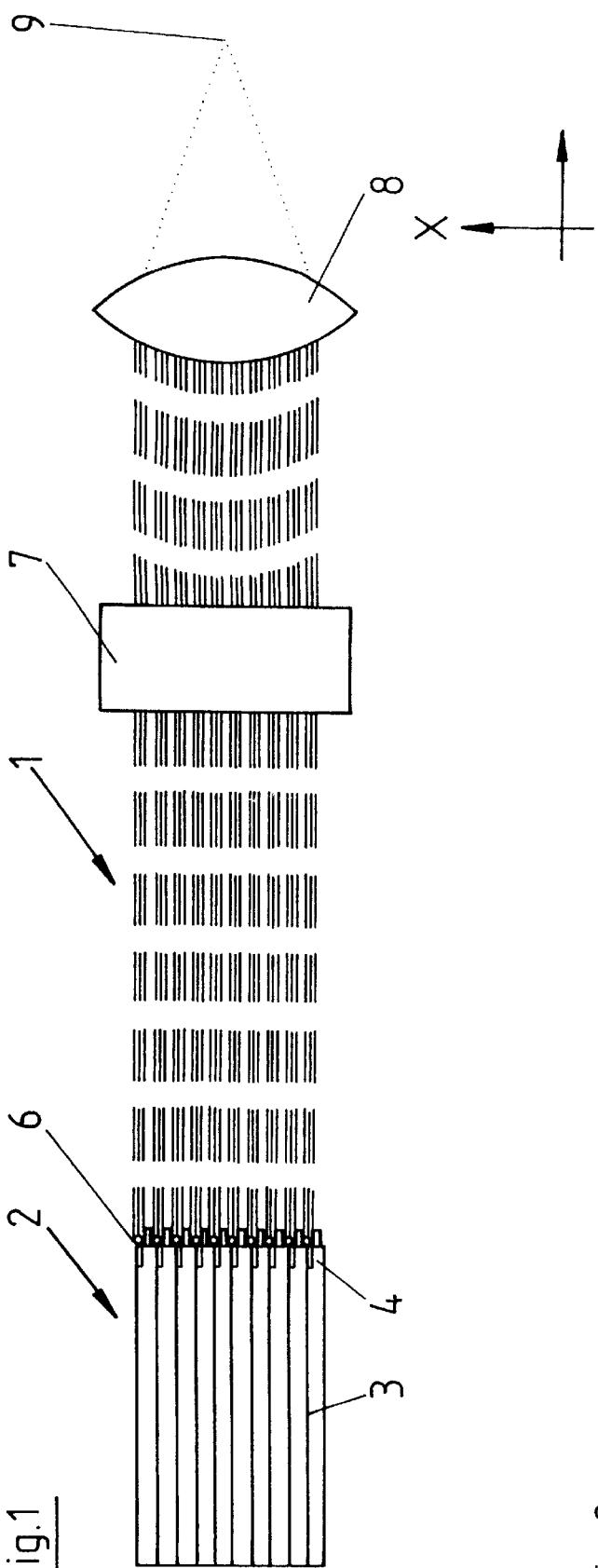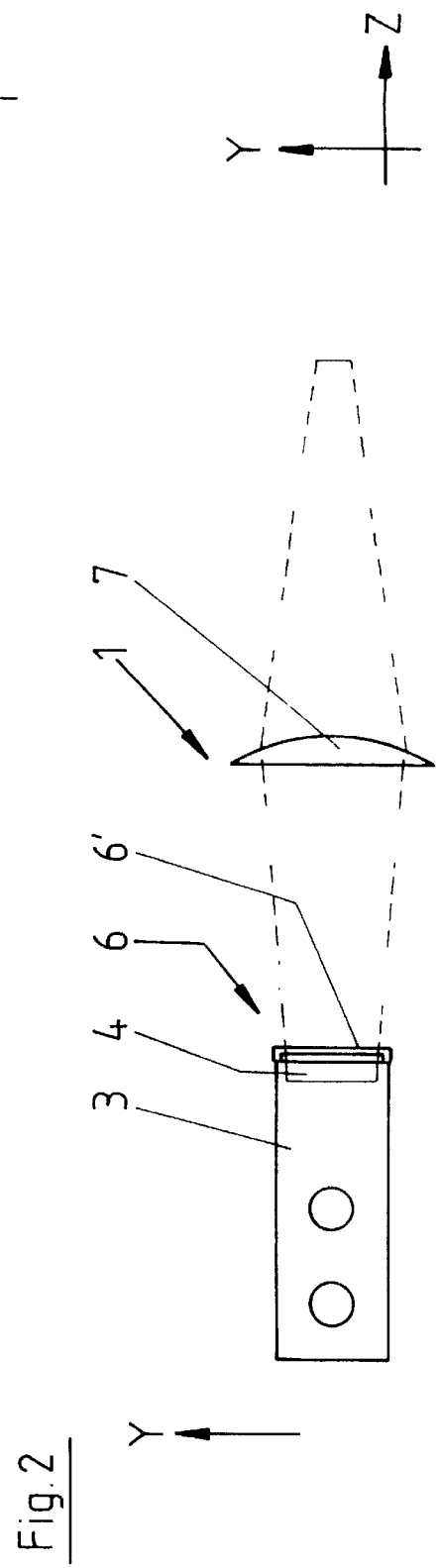

OPTICAL ARRANGEMENT FOR USE IN A LASER DIODE ARRANGEMENT

BACKGROUND OF THE INVENTION

The invention relates to an optical arrangement and to a laser diode arrangement with the optical arrangement.

The radiation of a semiconductor diode laser (here simplified, as a diode laser) is characterized by a highly diverging beam, in contrast to conventional laser radiation sources with a laser beam which has a diameter of a few millimeters with low beam divergence in the range of a few mrad, while the divergence for a diode laser exceeds 1000 mrad.

Furthermore, it is known that, in diode lasers, the angle of divergence in the plane, perpendicular to the active layer, i.e. in the so-called "fast axis", is greater than in the plane of the active layer, or in the so-called "slow axis".

To be able to fully use the radiation of a diode laser, which has at least one diode laser bar with several emitters which emit laser light, and which follow one another in the first coordinate direction, the use of collimating and focusing optical arrangements is known. These optical arrangements especially comprise a fast axis collimator which is made as microoptics and which is formed by one cylinder lens which lies with its axis in the first coordinate direction. For all emitters of a diode laser bar there is its own through cylindrical lens with a small focal distance in the immediate vicinity of the facet of the diode laser bar, i.e. at a distance of a few hundred microns from the emitters or from this facet.

To generate higher power laser radiation (for example, for materials working, for medical engineering, for pumping of FK lasers, etc.), it is known to use several diode laser bars in a diode laser stack in several stack layers on top of one another. To each diode laser bar of each stack layer its own fast axis collimator is assigned.

Optimum fast axis collimation requires parallel alignment of the individual beams of the emitter of each bar, so that the emitters are imaged on a line as straight as possible after collimation. In general this cannot be accomplished in ideal form due to nonconformities, i.e. deviations of conformity between the diode laser bars and the fast axis collimator. These deviations can be of varied origin, for example, due to production tolerances and/or deformations during installation, etc. These nonconformities lead, for example, to the emitters of the diode laser bar being imaged not on a straight line, but on a curved line (so-called smile effects) or as an elliptical or cushion-like surface. These imaging errors are generally undesirable since they lead, for example, to enlargement of a common focal spot.

It is an object of the invention is to eliminate these defects.

SUMMARY OF THE INVENTION

By dividing the fast axis collimator of at least one row of emitters into several collimator segments, the imaging errors, caused by the nonconformity between the diode laser bars and the fast axis collimator, can be almost completely corrected.

BRIEF DESCRIPTION OF THE FIGURES

The invention is detailed below on embodiments using the figures.

FIG. 1 shows in a simplified representation, and in a side view, a laser diode arrangement with several diode laser bars which are located on top of one another in the plane of the drawing (X-Z plane) of FIG. 1 in one coordinate direction (X-axis) and which have emitters which follow one another perpendicular to the plane of the drawing of the Figure (Y-axis), and with an optical arrangement for collimation and focussing of the beams of the individual emitters at a common focal spot;

FIG. 2 shows in a simplified representation an overhead view of one stack plane of the laser diode arrangement of FIG. 1 in a version according to the prior art;

DETAILED DESCRIPTION OF THE INVENTION

Figure 3:
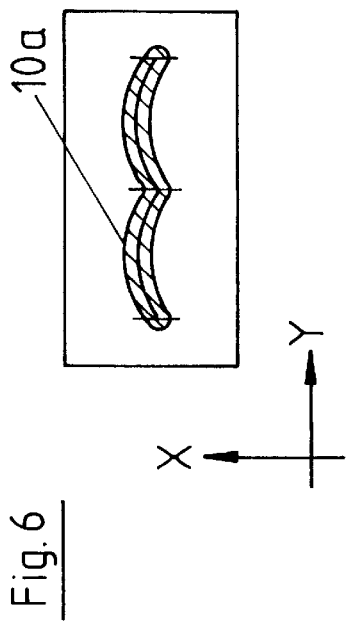
FIGS. 3 and 4 each show in a simplified representation the imaging of the laser radiation of the diode laser bar of the plane of FIG. 2, i.e. the laser radiation being collimated in the fast axis and the slow axis, for two different typical nonconformities.

In the figures, for simpler orientation and description, the three space axes or the coordinate directions which run perpendicular to one another, specifically the X-axis, Y-axis and Z-axis, are labeled X, Y and Z.

In FIGS. 1 and 2, a diode laser arrangement 1 is shown for high power. It includes the diode laser stack 2 which has several substrates 3, which are each made as a heat sink, which are stacked on top of one another, and which are provided on the common side of the stack with the diode laser bars 4, of which each bar 4 has a plurality of emitters 5 which emit laser light and is formed monolithically by a semiconductor chip. In the orientation of the X-, Y- and Z-axes selected for the figures, the substrates 3 in the direction of the X-axis adjoin one another in the stack. The diode laser bars 4 extend in the direction of the Y-axis, i.e. perpendicular to the plane of the drawing of FIG. 1. In this axial direction, the individual emitters 5 in each bar 4 follow one another. The active layer of the emitter 5 lies in the Y-Z plane.

The individual emitters 5 deliver a laser beam which both in the fast axis, i.e. in the X-axis or in the X-Z plane, and also in the slow axis, i.e. in the Y axis and in the Y-Z plane, has divergence. To eliminate this beam divergence, optical correction elements are used, especially directly on the respective diode laser bar 4, a fast axis collimator 6, for example, in the form of a microcylinder lens 6', which is located with its axis in the direction of the Y-axis, and thus parallel to the lengthwise extension, or the facet of the respective diode laser bar 4. For each stack layer, or plane formed by the substrate 3 with the diode laser bars 4, there is a separate fast axis collimator 6.

Due to the short distances between the individual diode laser bars 4, or the individual stack planes (in the direction of the X-axis) for the cylinder lenses 6' used as the fast axis collimators, a short focal distance of a few hundred microns to a few mm is necessary.

Following on the fast axis, collimators 6 in the beam direction, i.e. in the direction of the Z-axis, there is another optical element 7 for slow axis collimation, for example, in simplest form as a macrocylinder lens which with its axis is oriented in the direction of the X-axis. Focusing optics 8, with which the individual emitters 5 of the diode laser stack 2 are imaged in a common focal spot 9, follow on the slow axis collimator 7 in FIG. 1 in the radiation direction (Z-axis).

The disadvantage in this known diode laser arrangement is that the fast axis collimators 6, or the cylinder lenses 6', which form these collimators are each made continuous for each diode laser bar 4. Calibration of the fast axis collimators 6 is done such that the alignment of the axis of the respective continuous cylinder lens 6' to the axis of the pertinent bar 4 ensures parallel alignment of the beams of the individual emitters 5 to the Y-Z plane, but in practice major deviations from ideal calibration (parallel) cannot be avoided, for example, due to a deviation of shape (nonconformity) between the respective bar 4 and the fast axis collimator 6. This nonconformity can, for example, be caused by slight deformation of the substrates 3 and the laser bars 4. When these substrates are braced to the diode laser stack 2 deformation occurs, or nonconformity is due to tolerances in the production of the substrates 3 with the diode laser bars 4 and/or the fast axis collimators 6, etc. In these nonconformities with optimum calibration after fast axis collimation with the continuous cylinder lens 6', the desired ideal imaging of the activated bar 4 or the bar 4 which emits the laser light in the X-Y plane as a straight line does not occur, but according to FIGS. 3 and 4 a faulty image 10 or 11 arises.

Figure 4:
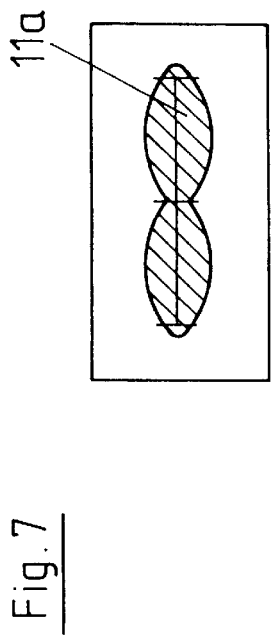

In the representation in FIG. 3, it was assumed that nonconformities are present such that the axis of the cylinder lens 6' and/or of the bar 4 is curved around the Z-axis so that deformed imaging in the form of a curved line 10 results. This imaging error is also called the "smile effect". In the representation in FIG. 4, it was assumed that the nonconformities consist in a curvature of the axis of the cylinder lens 6' and/or the facet of the bar 4 around the X-axis so that deformed imaging 11 in the form of an elliptical surface arises.

These imaging errors take effect especially dramatically in the stacked version, since due to the short distance of the individual stack planes in the direction of the X-axis the focal distance of the cylinder lenses 6' is limited. The imaging errors then lead to superposition of deformed imagings of the activated bars 4 at a common focal spot 9 and thus considerable spreading of the focal spot 9, especially in the X-axis.

Figure 6:
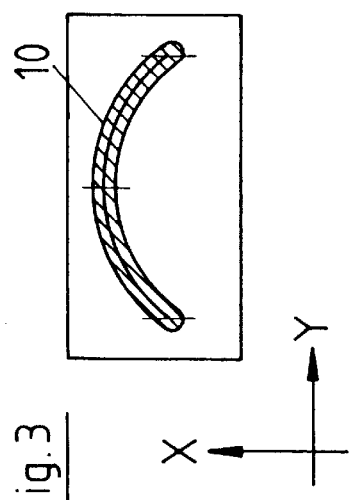
FIGS. 6 and 7 each show imaging of the collimated laser beam of the laser diode arrangement of FIG. 5 for typical nonconformities.
Figure 7:
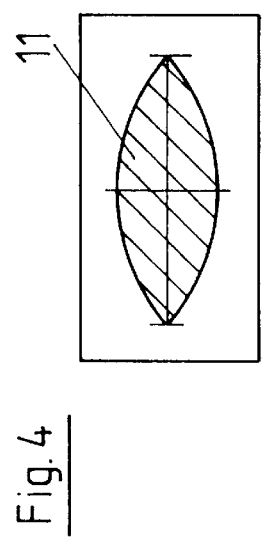
Figure 5:
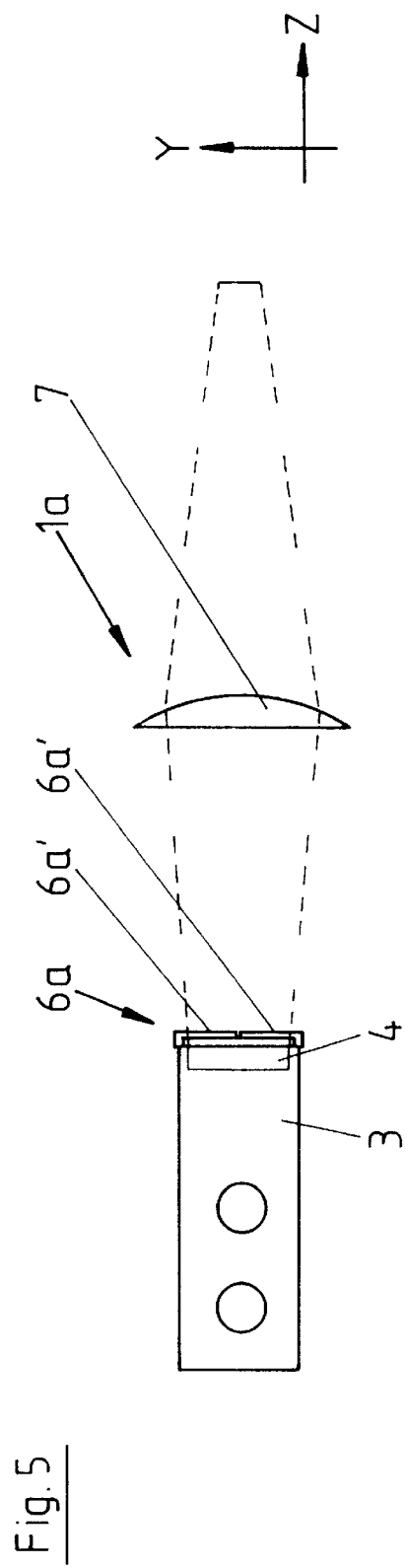
FIG. 5 shows in a representation similar to FIG. 2 a first possible embodiment of the invention.
Figure 8:
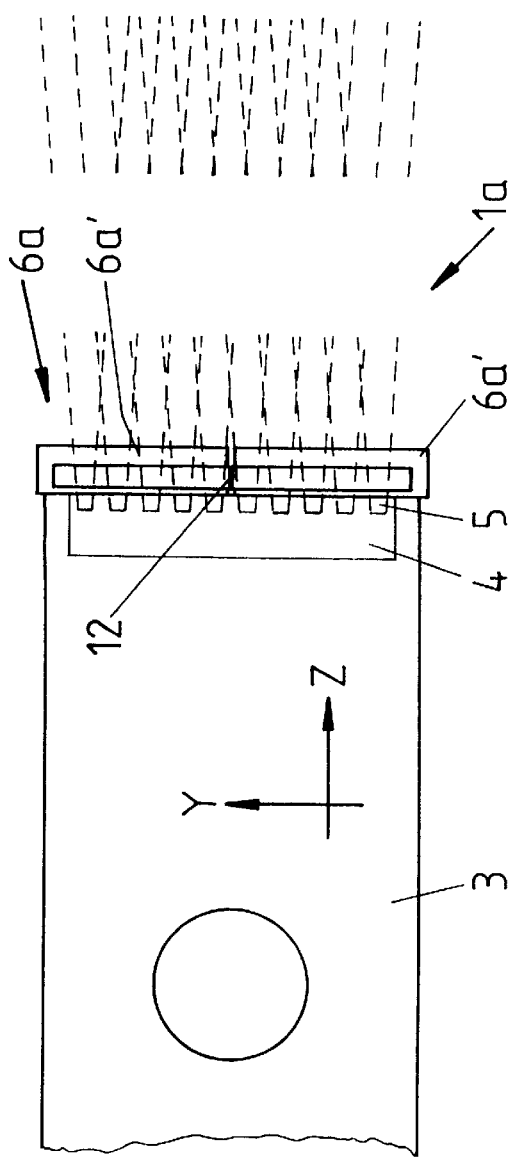
FIGS. 8–10 show in an enlarged partial representation the diode laser stack of the embodiment of FIG. 5 in an overhead view, in a side view and in a front view, looking at the fast axis collimators.
Figure 10:
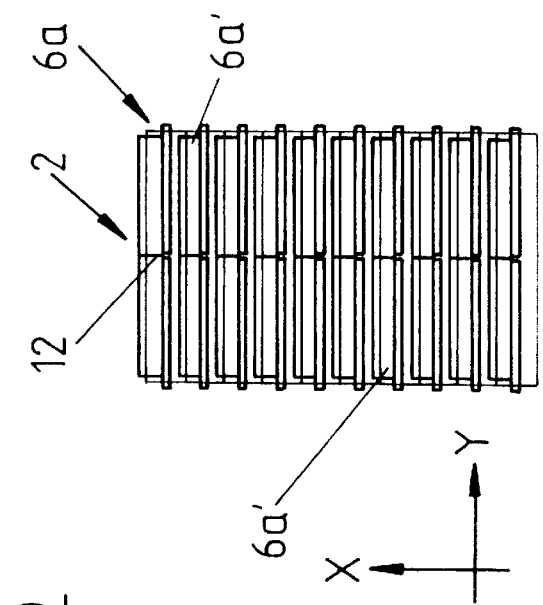
Figure 9:
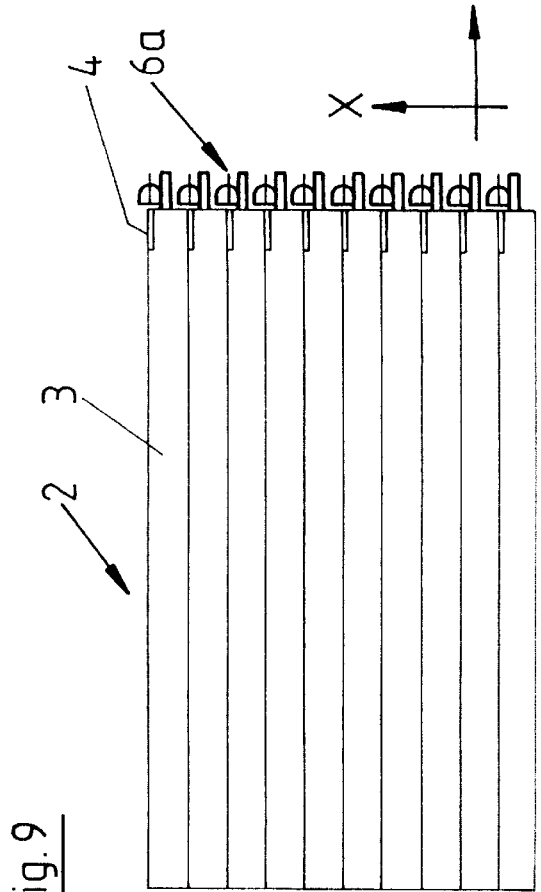
Figure 11:
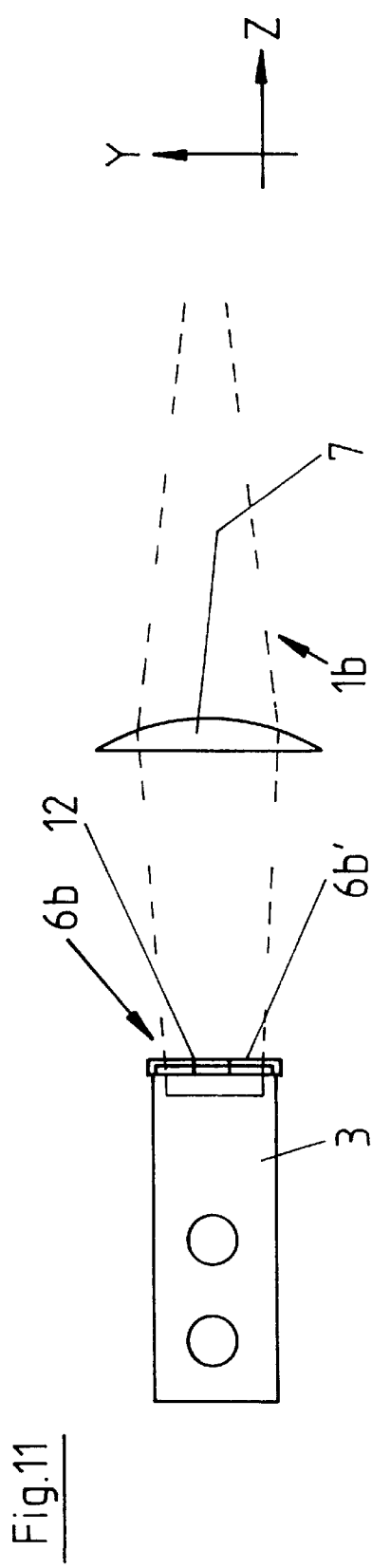
FIG. 11 shows a representation like FIG. 5 in another possible embodiment.
Figure 13:
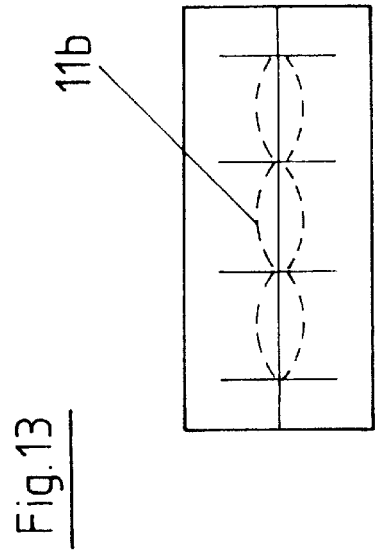
FIGS. 12 and 13 show imaging of the collimated laser radiation of the diode laser bar of the stack layer of FIG. 11 for typical nonconformities.
Figure 12:
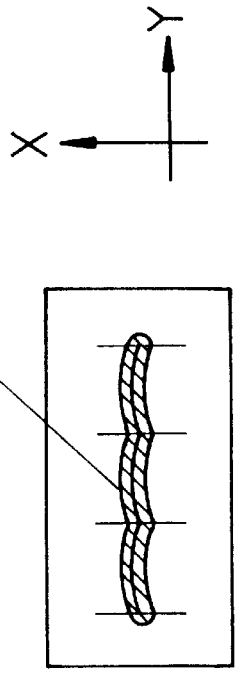
Figure 15:
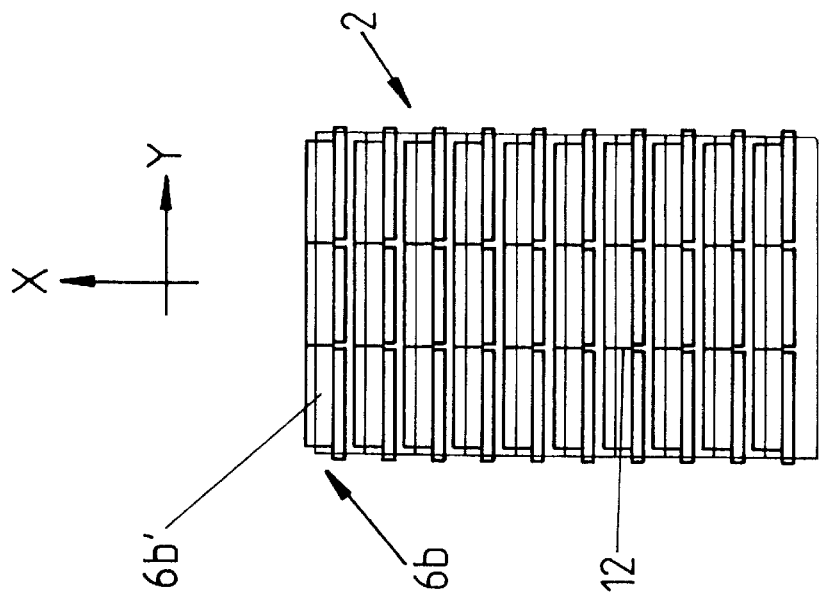
FIGS. 14 and 15 show the diode laser stack of the embodiment of FIG. 11 in a side view and in a front view of the fast axis collimators.
Figure 14:
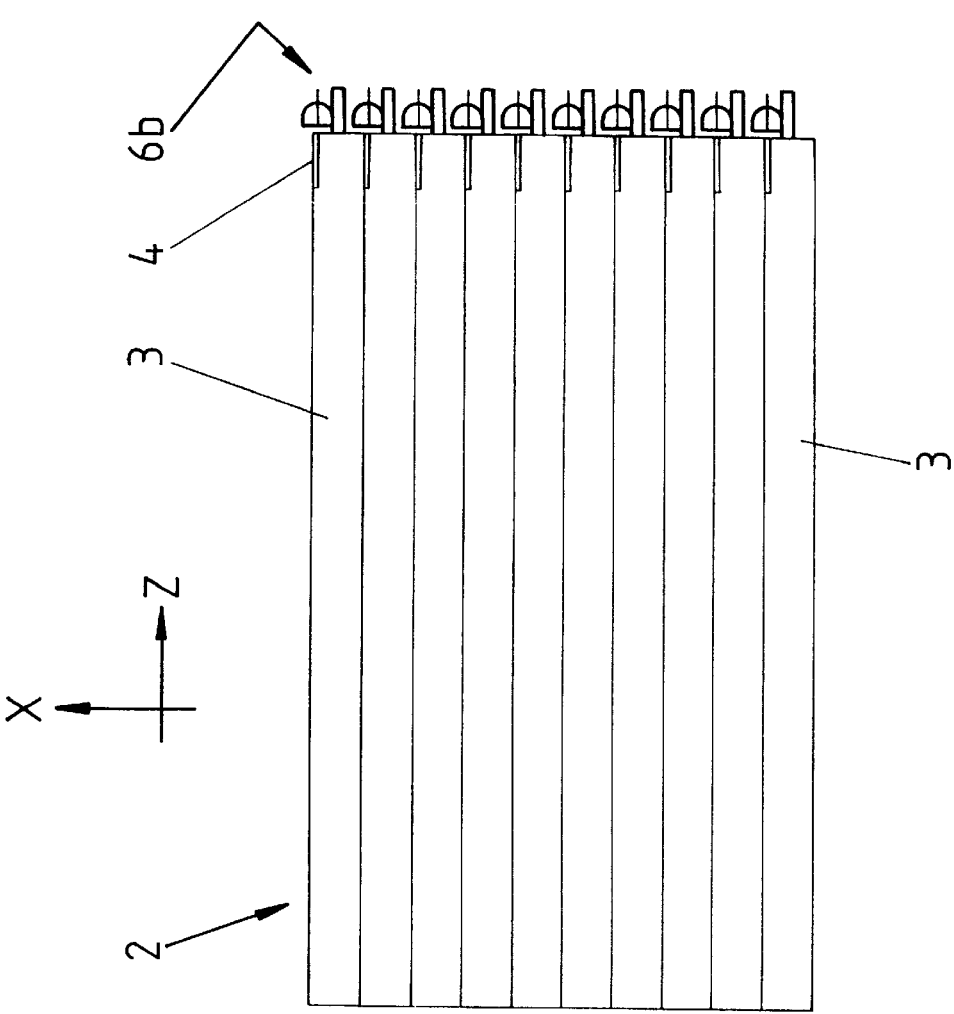

With the present invention, this above-described error of fast axis collimations is eliminated. For this reason, in the diode laser arrangement 1a of FIGS. 5–10, a fast axis collimator 6a is used which consists of several segments which adjoin one another in the direction of the Y-axis, i.e. in the diode laser arrangement 1a of two segments or cylinder lenses 6a'. As shown in FIGS. 6 and 7, by this division of each fast axis collimator 6a into two segments, the effect of both the imaging error 10 and also the imaging error 11 is greatly reduced, i.e. image 10a and 11a of the diode laser bars 4, in spite of the existing nonconformities is strongly matched to the ideal form of a straight line. To achieve this as optimally as possible, the two cylinder lenses 6a' of each collimator 6a can be individually calibrated in installation.

The two segments or cylinder lenses 6a', of each collimator 6a are spaced slightly away from one another and form a gap 12 between each other. The width of this gap is as small as possible. Furthermore, the gap 12 is positioned such that it is located in the middle between two emitters 5 (for example, FIG. 8) so that all emitters 5 emit onto the useful surfaces of the cylinder lenses 6a'. The correction achieved with segmentation of the collimators 6a greatly improves the beam quality in the Y-Z plane and especially also enlarges the common focal spot 9 in the X-axis.

FIGS. 11–15 show as another possible embodiment, a diode laser arrangement 1b which differs from the diode laser arrangement 1a, in that each fast axis collimator 6b consists of three segments which follow one another in the direction of the Y-axis and which are formed in turn by one cylinder lens 6b' at a time, in the embodiment shown. Between the cylinder lenses there are gaps 12 as narrow as possible, which are in turn positioned such that each gap 12 is located in the middle between two emitters 5 and all emitters 5 emit onto the useful surfaces of the cylinder lenses 6b'. With the triple segmented collimators 6b, more complex nonconformities or deviations of shape between the respective diode laser bars 4 and the pertinent fast axis collimator 6b can be corrected (images 10b and 11b of FIG. 12 and 13).

The invention was described above in view of the preferred embodiments. Numerous modifications and versions are possible without departing from the inventive idea underlying the invention.

| Reference number list | |
|---|---|
| 1, 1a, 1b | diode laser arrangement |
| 2 | diode laser stack |
| 3 | substrate or heat sink |
| 4 | diode laser bar |
| 5 | emitter |
| 6, 6a, 6b | fast axis collimator |
| 6', 6a', 6b' | cylinder lens |
| 7 | macrooptics, especially also for slow axis collimation |
| 8 | focusing optics |
| 9 | focal spot |
| 10, 11 | deformed imaging |
| 10a, 10b, 11a, 11b | corrected imaging |
| 12 | gap |

What is claimed is:

1. An optical arrangement for imaging several emitters of a laser diode arrangement in a focal point, said emitters forming at least one emitter-row, the emitters of said at least one emitter-row having active layers located in a common plane (Y-Z) plane, and following one another in a first coordinate axis (Y-axis) in said common plane, said optical arrangement comprising for each emitter-row a fast axis collimator for collimation of the laser radiation in a second coordinate direction (X-axis) which is perpendicular to the common plane (X-Z-plane
    said fast axis collimator of each emitter-row being segmented such, that it forms a plurality of individual collimator segments which follow one another in the first coordinate axis (Y-axis) and which are calibrated and fixed individually.

2. The optical arrangement as claimed in claim 1, wherein the fast axis collimator of the at least one row of emitters has two or three segments.

3. The optical arrangement as claimed in claim 1, wherein there is a connection area of gap between two succeeding collimator segments between two emitters, in the approximate middle between the two emitters.

4. The optical arrangement as claimed in claim 1, wherein the collimator segments are each optical elements with properties of a cylinder lens.

5. The optical arrangement as claimed in claim 1, wherein the collimator segments are cylinder lenses.

6. The optical arrangement as claimed in claim 1, wherein the at least one row of emitters is formed by a diode laser bar.

7. The optical arrangement as claimed in claim 6, wherein the diode laser bar is a semiconductor laser chip with a plurality of emitters.

8. The optical arrangement as claimed in claim 1, wherein there are several rows of the emitters in a second coordinate direction (X-axis) following one another in a diode laser stack, and wherein to each row of the several rows of emitters a segmented fast axis collimator is assigned.

9. The optical arrangement as claimed in claim 1, further comprising at least one other optical means which follows in the direction of a team axis (Z-axis) on the fast axis collimator for beam forming, or for slow axis collimation, of laser beams in the first coordinate direction (Y-axis) or in the axial direction which corresponds to the first coordinate direction.

10. The optical arrangement as claimed in claim 1, further comprising focusing optics for imaging of the rows of the emitters in the common focal spot.

11. A laser diode arrangement with at least one diode laser bar which in a first coordinate direction (Y-axis) has a plurality of emitters which follow one another, with the at least one diode laser bar being located on top of one another in a diode laser stack in a second coordinate direction (X-axis), comprising an optical arrangement, for forming laser radiation of the emitters, of claim 1.

* * * * *